(12) United States Patent
Thomas

(10) Patent No.: US 7,870,312 B2
(45) Date of Patent: Jan. 11, 2011

(54) AUTOMATIC MAINTENANCE OF CONFIGURATION INFORMATION IN A REPLACEABLE ELECTRONIC MODULE

(75) Inventor: William J. Thomas, Carmichael, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 181 days.

(21) Appl. No.: 12/047,254

(22) Filed: Mar. 12, 2008

(65) Prior Publication Data

US 2008/0215844 A1    Sep. 4, 2008

Related U.S. Application Data

(62) Division of application No. 10/630,067, filed on Jul. 30, 2003, now Pat. No. 7,363,392.

(51) Int. Cl.
*G06F 3/00* (2006.01)
*G06F 7/04* (2006.01)

(52) U.S. Cl. .................. 710/36; 710/10; 710/11; 710/14; 710/16; 726/2; 726/26

(58) Field of Classification Search ................. None
See application file for complete search history.

(56) References Cited

U.S. PATENT DOCUMENTS

| | | | |
|---|---|---|---|
| 5,579,511 A | 11/1996 | Cavasa et al. | |
| 6,000,000 A | 12/1999 | Hawkins et al. | |
| 2002/0152373 A1* | 10/2002 | Sun et al. | 713/150 |
| 2003/0048613 A1 | 3/2003 | Garnett et al. | |
| 2004/0010643 A1 | 1/2004 | Thomas | |
| 2004/0230785 A1 | 11/2004 | Ramiz et al. | |
| 2004/0243798 A1 | 12/2004 | Goud et al. | |
| 2004/0243991 A1 | 12/2004 | Gustafson et al. | |
| 2004/0255286 A1 | 12/2004 | Rothman et al. | |
| 2004/0268120 A1* | 12/2004 | Mirtal et al. | 713/156 |

FOREIGN PATENT DOCUMENTS

| | | |
|---|---|---|
| EP | 1239367 | 9/2002 |
| GB | 2356715 | 5/2001 |
| WO | 0022520 | 4/2000 |
| WO | 02057859 | 7/2002 |
| WO | 02073408 | 9/2002 |

OTHER PUBLICATIONS

GB Search Report. GB Application No. GB0416391.1. Nov. 16, 2004.

* cited by examiner

*Primary Examiner*—Alan Chen

(57) ABSTRACT

The present invention provides methods and systems to automatically manage hardware and software capabilities of replaceable electronic modules as the modules are replaced or reassigned to different tasks. Each such module stores configuration information in a persistent memory. This configuration information enables the module to use only selected hardware and to execute only selected software. A replaceable electronic module manager stores copies of each module's configure information in a separate persistent memory. When a module is replaced, a copy of the configuration information is fetched from the module manager's persistent memory and sent to a replacement module, thereby making the replacement module functionally equivalent (from a point of view of which hardware can be used by the module or which software can be executed by the module) to the replaced module. In addition, when a module is assigned to a different task, appropriate configuration information can be sent to the module, so the module can appropriately perform the assigned task, such as use selected hardware or execute selected software.

22 Claims, 7 Drawing Sheets

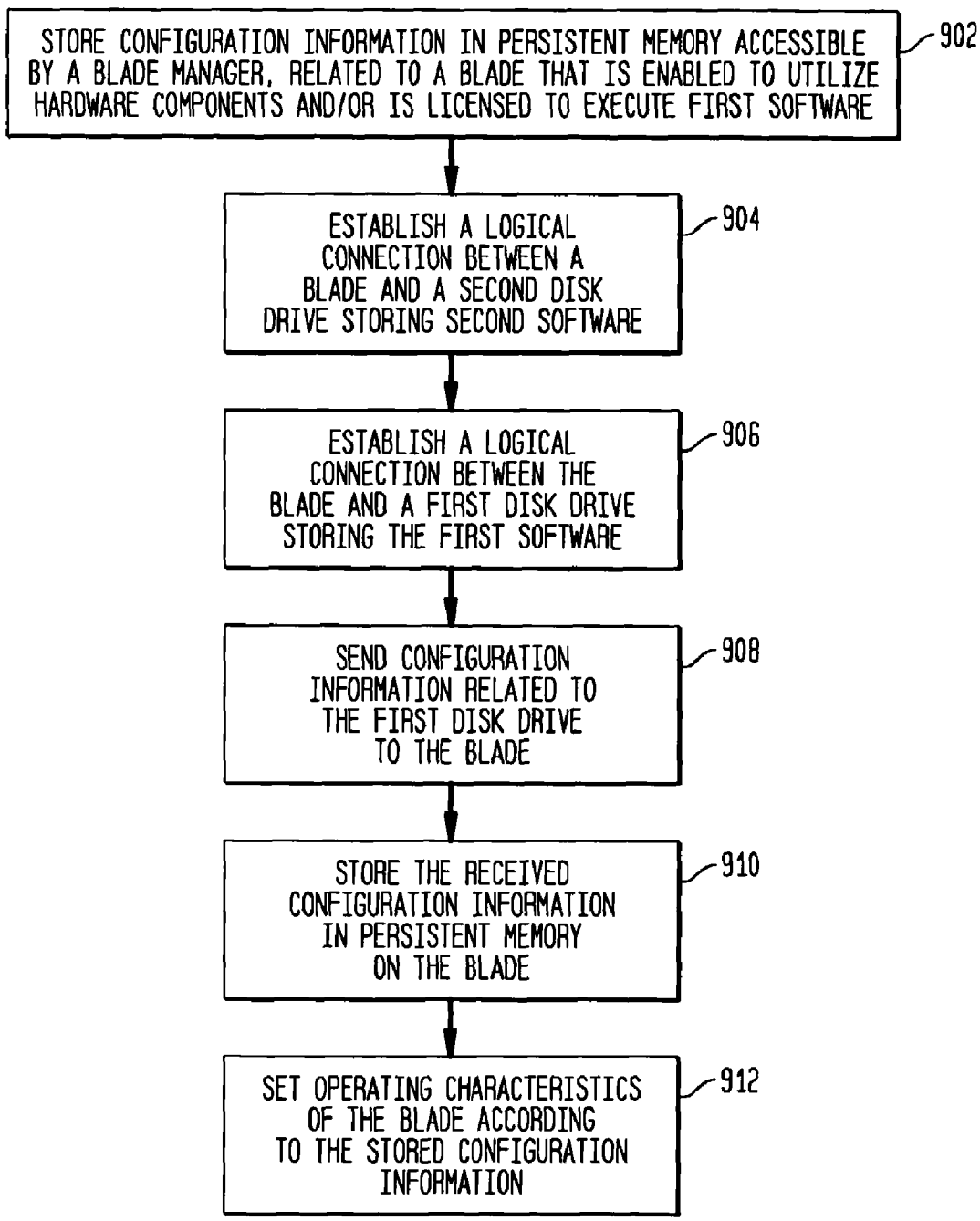

AUTOMATIC MAINTENANCE OF CONFIGURATION INFORMATION IN A REPLACEABLE ELECTRONIC MODULE

CROSS-REFERENCE TO RELATED APPLICATION

This application is a divisional application of U.S. patent application Ser. No. 10/630,067 entitled "Automatic Maintenance Of Configuration Information In A Replaceable Electronic Module", filed Jul. 30, 2003, now U.S. Pat. No. 7,363,392 which is hereby incorporated by reference herein.

BACKGROUND OF THE INVENTION

1. Field of the Invention

The present invention relates generally to replaceable electronics modules and, more particularly, to automatically maintaining configuration information in replaceable electronic modules.

2. Related Art

Advances in miniaturization of computer, communication and other electronic equipment have led to the development of so-called "blade" systems, which permit several circuit boards ("blades") to be installed in a single chassis. The chassis typically includes components, such as power supplies, cooling fans, a blade manager and other components that are shared by all the blades installed in the chassis. The blades typically plug into a backplane of the chassis, which distributes power and data signals between the blades and blade manager, and other components. This arrangement enables a large number of blades to be housed in a relatively small chassis. Oftentimes, the chassis is dimensioned to be mounted in a rack, such as a server rack with other rack-mounted equipment.

Blades are typically designed to be "hot swappable", that is, they can be installed into or removed from a chassis without removing power from all components in the chassis. This enables an operator or system manager to replace a failed or failing blade with a replacement blade without adversely affecting real-time operations of other chassis components. In addition, spare blades can be installed in a chassis, without activating them, to serve as "hot standby" blades.

Blades can perform various functions. Most blades contain entire computers, including single or multiple processors, memory and network interfaces. Most computer blades are used as servers while others are used as communication devices, such as routers, firewalls or switches. Some blades contain specialized hardware components, in addition to or instead of processors, memory, etc. Typically, any type of blade can be plugged into any slot of a chassis. This enables an operator or system manager to "mix and match" blades in a chassis so that requisite operations can be performed by the blade system. In addition, the mixture of blade types can be changed to accommodate changes in operational requirements.

Some server blades include disk drives. Other blades access disk drives that are located elsewhere in the chassis or are connected to the chassis by computer network hardware. Logical network connections between these blades and off-blade disk drives can be established by the blade manager. Since these blades can be connected to different disk drives containing different software at different times, these blades can execute different operating systems and/or application programs, and can access different data at different times. For example, a system operator might choose to logically connect a blade to different disk drives to execute different application programs at different times of a day. In another example, if a blade fails, logical connections from off-blade disk drives that were formerly used by the failed blade can be redirected to a replacement or hot standby blade.

Some blades can be field-upgraded, such as by installing additional memory, processors or other components on the blades. In contrast, some manufacturers prefer to produce blades that are fully populated with such additional hardware. These manufacturers selectively enable or disable the additional hardware when the blades are manufactured, to tailor the blade capabilities to the to customers' initial needs and budgets. Later, if a customer purchases a license to upgrade a blade, all or a portion of the additional hardware can be enabled without reconfiguring (which requires removal of the blade from the chassis) or replacing the blade.

Typically, blade configuration information is stored in an electrically-erasable programmable read-only memory (EE-PROM) on each blade. This configuration information can include the blade's serial number and other license information, such as the amount of memory and number of processors that are enabled, i.e., permitted to be operational. When such a blade is to be upgraded, a system manager or field service technician updates the license information stored in the EE-PROM. The system manager, technician, or operator (hereinafter "system manager") typically connects a keyboard, monitor and mouse to the blade or the blade manager and thereby enters the license information.

Similarly, some software is licensed on a per-blade basis. Such software typically accesses the blade's serial number or other license information in the EE-PROM each time the software begins executing to ascertain if it is being executed by a licensed blade.

The ease with which failed blades can be replaced, and the ability to logically connect different disk drives to a blade at different times, have made blade systems popular with data centers and information technology (IT) managers. When a replacement blade is installed it must be configured to have similar hardware and software capabilities as the replaced blade to continue operations under the established license.

For example, if a failed blade is replaced, its replacement blade should have software license information and a hardware configuration (e.g. number of processors, amount of memory, I/O devices, etc.) similar to the failed blade. A system manager must typically enter configuration information into the EE-PROM of the replacement blade Typically such configuration information is the same as or similar to the failed blade's configuration information. Because the serial number of the replacement blade can be changed in its EE-PROM, software that is licensed to be executed by the failed blade can be executed by the replacement blade.

There are other circumstances in addition to license upgrades and blade replacement in which the configuration information must be changed. For example, when a blade is logically redirected to a different (second) disk drive, the system manager must typically enter configuration information into the EE-PROM of the blade to inform it of the disk drive to use and/or enable hardware and/or licenses required by software that will be executed from the second disk drive.

To be able to enter appropriate configuration information into blades, a system manager typically records configuration information for each blade of a blade system. However, recording the configuration information for each blade poses problems. Some system managers have resorted to writing configuration information on pieces of tape and adhering the tape pieces to the blades or chassis adjacent to where the blades are installed. However, the high density of blades in a blade system makes this solution less than satisfactory. Furthermore, entering this configuration information through a keyboard and monitor is error prone.

SUMMARY OF THE INVENTION

In one aspect of the invention, a method of automatically maintaining configuration information of a replaceable electronic module is disclosed. The method comprises installing the replaceable electronic module; receiving from the replaceable electronic module first configuration information related to capabilities of the replaceable electronic module to utilize permitted portions of its hardware or to execute permitted software; and storing at least some of the received first configuration information in a first persistent memory that is not on the replaceable electronic module and that is thereafter accessible by a replaceable electronic module manager regardless of whether the replaceable electronic module remains installed or is subsequently uninstalled.

In another aspect of the invention, a method of automatically maintaining configuration information of a replaceable electronic module is disclosed. The method comprises installing the replaceable electronic module; automatically detecting if the replaceable electronic module is a replacement replaceable electronic module that replaces a previously installed replaceable electronic module; and if the replaceable electronic module is a replacement replaceable electronic module, sending previously stored first configuration information to the replacement replaceable electronic module.

In yet another aspect of the invention, a method of upgrading a replaceable electronic module is disclosed. The method comprises storing configuration information in a persistent memory on the replaceable electronic module, wherein the configuration information enables a previously unenabled capability of the replaceable electronic module; and storing the configuration information in a persistent memory located off the replaceable electronic module.

In a further aspect of the invention, a method of dynamically maintaining configuration information of a replaceable electronic module is disclosed. The method comprises detecting when the replaceable electronic module is assigned a function; sending previously stored configuration information to the replaceable electronic module, wherein the previously stored configuration information corresponds to the assigned function; and storing the configuration information on the replaceable electronic module, wherein the configuration information enables the replaceable electronic module to utilize a hardware capability of the replaceable electronic module or enables software to be executed by the replaceable electronic module.

In another aspect of the invention, a replaceable electronic module is disclosed. The replaceable electronic module comprises a persistent memory; and a replaceable electronic module controller configured to: enable capabilities of the replaceable electronic module according to configuration information stored in the persistent memory; send at least a portion of the configuration information stored in the persistent memory to an automatic replaceable electronic module manager; and receive replacement configuration information from the automatic replaceable electronic module manager and store the replacement configuration information in the persistent memory.

In a further aspect of the invention, an electronic system for automatically maintaining configuration information in a replaceable electronic module is disclosed. The electronic system for automatically maintaining configuration information in a replaceable electronic module comprises the replaceable electronic module and an automatic replaceable electronic module manager; wherein the replaceable electronic module comprises: a first persistent memory; and a controller configured to: enable capabilities of the replaceable electronic module according to configuration information stored in the first persistent memory; send at least a portion of the configuration information stored in the first persistent memory to the automatic replaceable electronic module manager; and receive replacement configuration information from the automatic replaceable electronic module manager and store the replacement configuration information in the first persistent memory; and wherein the automatic replaceable electronic module manager comprises: a second persistent memory; and wherein the automatic replaceable electronic module manager is configured to: receive the configuration information sent by the replaceable electronic module; store the configuration information received from the replaceable electronic module in the second persistent memory; and send at least a portion of the configuration information stored in the second persistent memory to the replaceable electronic module as the replacement configuration information.

In yet another aspect of the invention, method of licensing software for execution by a replaceable electronic module is disclosed, wherein the replaceable electronic module is installed in, and removable from, a system that includes an automatic replaceable electronic module manager. The method comprises acquiring a license key for the software, the license key comprising data; providing the license key to the replaceable electronic module, thereby enabling the software to be executed by the replaceable electronic module; sending the license key from the replaceable electronic module to the automatic replaceable electronic module manager; and storing the license key in a first persistent memory that is not on the replaceable electronic module and that is thereafter accessible by the automatic replaceable electronic module manager regardless of whether the replaceable electronic module remains installed or is subsequently removed the system.

BRIEF DESCRIPTION OF THE DRAWINGS

FIG. 9 is a flowchart illustrating how a blade of the blade system of FIGS. 1 and 2 can be appropriately reconfigured to enable hardware and execute licensed software after the blade is logically connected to a different disk drive, in accordance with one embodiment of the present invention.

DETAILED DESCRIPTION

The present invention provides methods and systems to automatically manage hardware and software capabilities of replaceable electrical or electronic modules (hereinafter "electronic module(s)") as the electronic modules are replaced or reconfigured to perform different tasks. Each electronic module stores configuration information in a persistent memory. This configuration information enables the electronic module to use only selected hardware or to execute only selected software. A replaceable electronic module manager (hereinafter "module manager") stores a copy of the electronic modules' configuration information in a separate persistent memory. When an electric module is replaced, a copy of the module's configuration information is fetched from the module manager's persistent memory and sent to a replacement module, thereby making the replacement module functionally equivalent (from a point of view of the capabilities of the module) to the replaced module. As used herein, the term capabilities refers to hardware, or a subset thereof, which is enabled or licensed for use on the electronic module, or which software is enabled or licensed to be executed by the module. In addition, when an electronic module is assigned a different task, appropriate configuration information can be sent to the module, so the module can appropriately perform the assigned task, such as appropriately use selected hardware or execute selected software.

Replaceable electronic modules include blades; circuit boards that connect to other circuits by plugs, sockets, soldered wire connections or any other conventional electrical connection; "daughter" boards; integrated circuits; monitors; peripheral devices; power supplies; telephones; appliances; and any electronic component, circuit or subsystem (hereinafter, electronic module) that can be connected to other modules, as long as the modules can be initially connected to the other modules or they can be disconnected from their respective modules and the same or replacement modules can be connected in their places. For purposes of providing an example, the present invention will be described in the context of a blade system. As noted, a blade system is a printed circuit board which is installed in a chassis along with a plurality of other printed circuit boards, or blades. In such a system, blades can fail and be replaced by replacement blades. The failed blades can be left in, or removed from, the blade system. In addition, blades can be replaced for reasons other than blade failure, such as to facilitate blade testing. One of ordinary skill in the art can, however, apply the teachings herein to other types of modules, including but not limited to those listed above.

Figure 1:
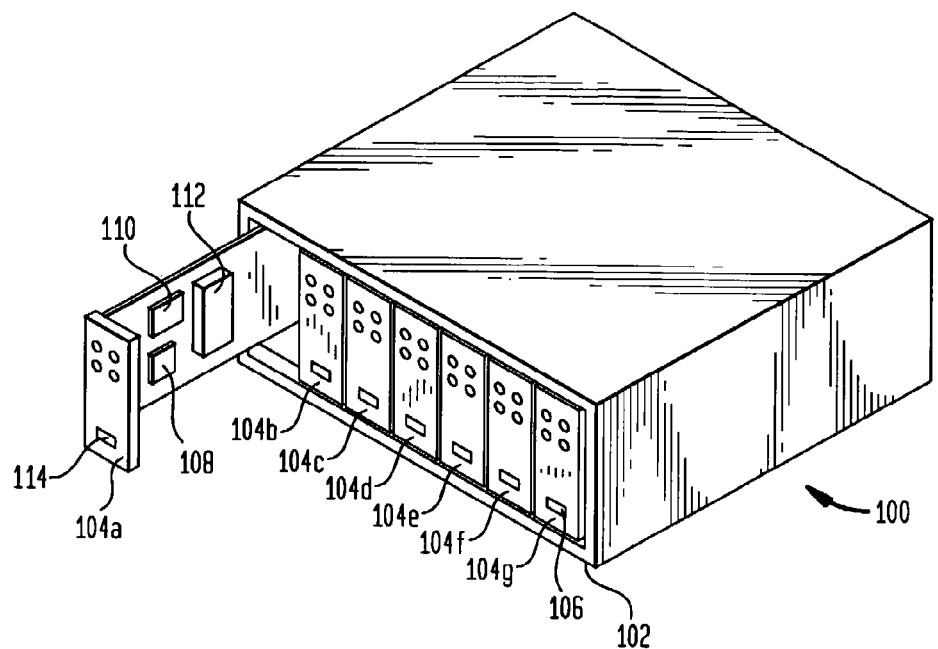
FIG. 1 is a perspective view of an exemplary blade system, in which aspects of the present invention can be implemented.

FIG. 1 is a diagram illustrating an exemplary blade system 100 suitable for implementing aspects of the present invention. For example, blade system 100 can house a combination of server blades, firewalls, routers and switches. A chassis 102 houses other components of blade system 100. Blades 104a-f slide into chassis 102 and plug into a backplane (not visible). Preferably, a blade manager 106 also slides into chassis 102 and plugs into the backplane, although the blade manager could be located inside the chassis. Blade manager 106 need not be removable, and for purposes of the present invention, need not be located in chassis 102. In addition, blade manager 106 can be connected to, and can control blades in, other chassis over a suitable network link. Each blade 104a-f contains appropriate components 108, 110 and 112, such as processors, memory, network interfaces, disk drives, etc., depending on the blade's intended function. Optionally, each blade 104a-f can include a connector 114, by which a keyboard, video monitor and mouse (collectively, "KVM") can be connected to the blade to provide a user interface therewith. Similarly, blade manager 106 can include an optional KVM connector 116 to provide a user interface with the blade manager.

Figure 2:
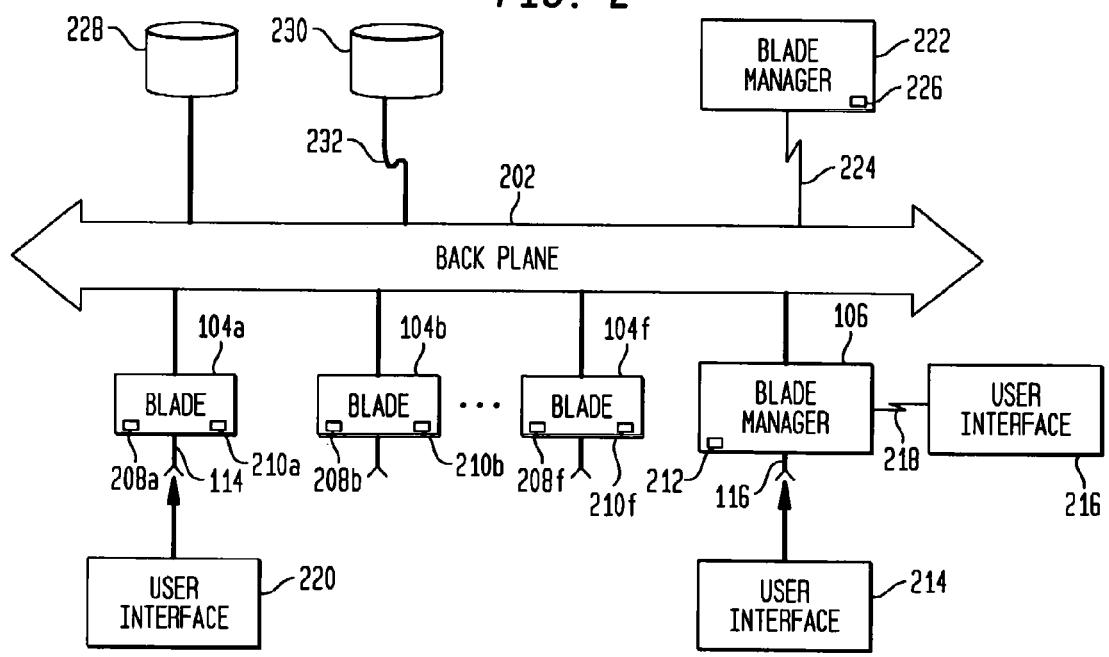
FIG. 2 is a schematic block diagram of the blade system of FIG. 1 illustrating components of the blade system, in accordance with one embodiment of the present invention.

FIG. 2 is an architectural block diagram of blade system 100. A backplane 202 interconnects components of blade system 100. Blades 104a-f and (optionally) blade manager 106 plug into backplane 202. Blade manager 106 communicates over backplane 202 with blade control circuits 208a-f on each of the blades 104a-f, respectively. This communication is preferably carried over a dedicated set of signal lines in backplane 202. Alternatively, this communication can be over shared data lines in backplane 202 or over a signal path separate from the backplane. For example, a separate wire or wireless Ethernet connection can be used. Blade control circuits 208a-208f control availability of power, operation state of processor(s), and other aspects of the blades 104a-f, as is well known in the art.

Each blade 104a-f includes an EE-PROM 210a-f, respectively, or other type of persistent memory to store configuration information for the blade. Any type of persistent memory that retains its contents without the availability of power can be used. The configuration information can include, for example, a serial number and license information, as described in detail below. The following discussion is presented in the context of blade 104a. Unless otherwise noted, the following description applies to any blade 104a-f.

Blade manager 106 also includes an EE-PROM 212 or other type of persistent memory. The blade manager's persistent memory need not be co-located with blade manager 106, as long as the persistent memory is accessible to blade manager. For example, the persistent memory can be a disk drive and/or it can be located elsewhere in chassis 102. Alternatively, the blade manager's persistent memory can be made up of several parts, each in a different location. Alternatively, blade managers 222 of several blade systems 100 can share a common persistent memory that is suitably connected to the blade managers. In the following discussion, persistent memory 212 will be referred to herein as EE-PROM 212 for simplicity, but the discussion applies to any form of persistent memory.

As discussed in relation to FIG. 1, a user interface 214 can be connected to blade manager 106 via the connector 116. Alternatively, a remote user interface 216 can be connected to blade manager 106 via a network link or other suitable connection 218. In the following discussion, reference to user interface 214 also applies to user interface 216. Optionally, a user interface 220 can connect to blade 104a via connector 114. Alternatively, user interface 214 or 216 can communicate with blade 104a. In this case, blade manager 106 relays commands and responses to and from blade 104a over backplane 202.

As discussed above, blade manager 106 need not be located within blade system 100. For example, remote blade manager 222 can communicate with blade system 100 over a communication link 224. Such a communication link 224 can be provided by, for example, a wire or wireless local area network (LAN). As with blade manager 106, remote blade manager 226 includes an EE-PROM or other suitable persistent memory 226 and can have a directly-connected or remote user interface (not shown), similar to the user interfaces 214 and 216. As discussed above, blade manager 106 can communicate with and control blades in another chassis via a communication link 226. The following discussion refers to blade manager 106. However, unless otherwise noted, the following discussion also applies to remote blade manager 222.

Disk drives, such as local disk drive 228 or remote disk drive 230, can be connected to backplane 202. Remote disk drive 230 can be connected to backplane 202 via a suitable network connection 232, as is well know in the art.

Figure 3:
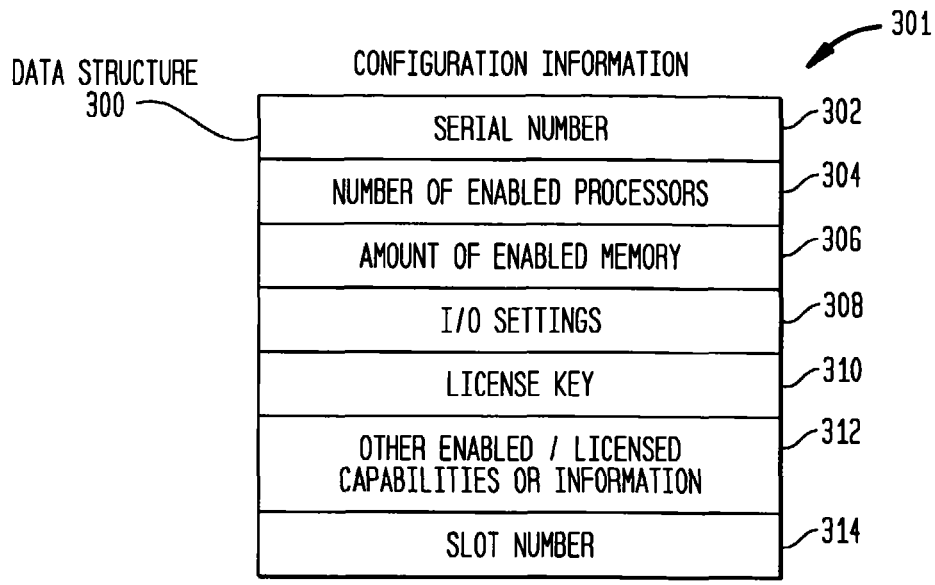
FIG. 3 is an exemplary diagram of a configuration information data structure used by the blade system of FIGS. 1 and 2, in accordance with one embodiment of the present invention.

FIG. 3 is a diagram of an exemplary data structure 300 containing configuration information 301 stored in EE-PROMs 208a-f of blades 104a-f. Configuration information 301 stored in EE-PROMs 208a-f enable the respective blades 104a-f to appropriately enable licensed hardware on blades 104a-f and/or software that is to be executed by blades 104a-f. Configuration information 301 can include one or more of the following for the respective blade 104: a blade serial number 302, a number of enabled processors 304, an amount of enabled memory 306, I/O settings 308 (such as number of enabled ports, enabled special hardware, etc.), a license key 310 (which can be used to license software, as described in more detail below), information about other enabled/licensed capabilities 312 (such as processor speed or number of digital signal processors (DSPs)), and a slot number 314 in which the blade is installed. It should be understood that in alternative embodiments additional or alternative items can be included in configuration information 301.

Blade manager 106 also stores in EE-PROM 212 configuration information 301 in a data structure similar to data structure 300 shown in FIG. 3. The items of configuration information stored in EE-PROMs of blades 104 need not, however, be the same items stored in EE-PROM 212 of blade manager 106. For ease of description, blades 104 and blade manager 106 have the same configuration information 301.

Figure 4:
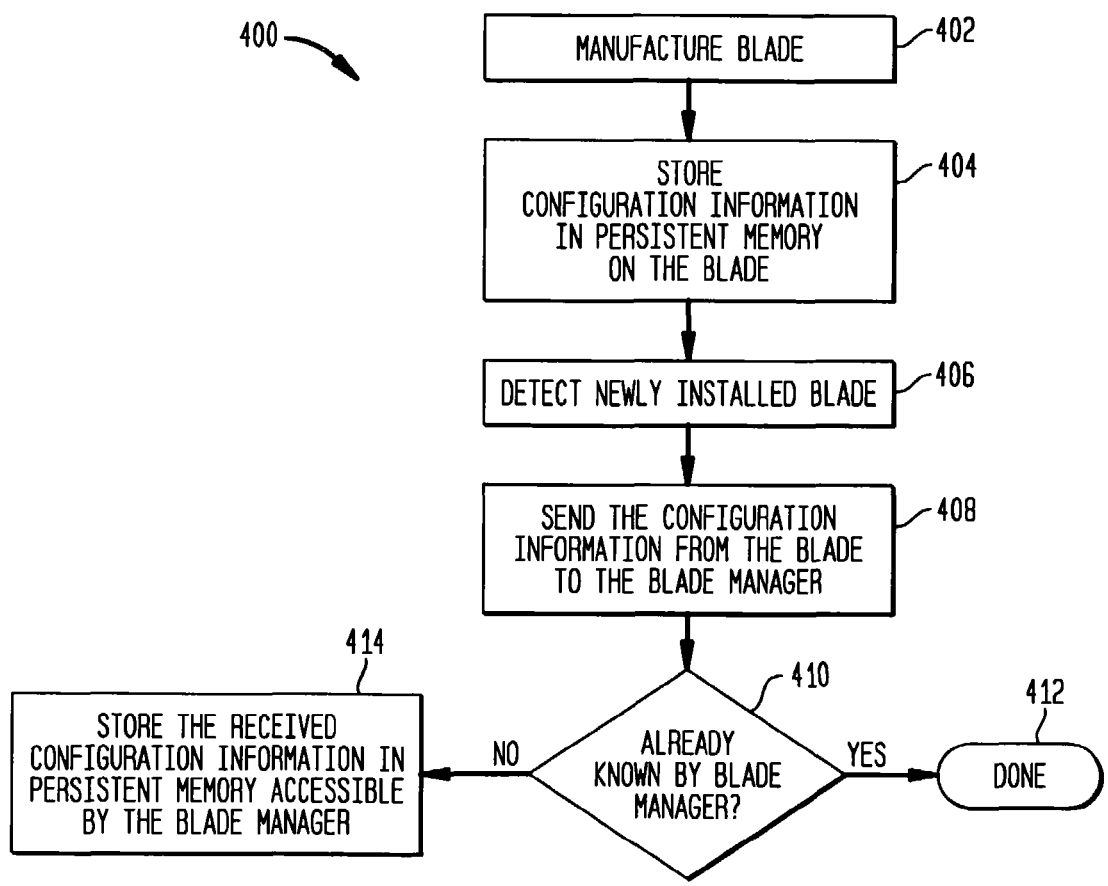
FIG. 4 is a flowchart illustrating how a blade manager of the blade system of FIGS. 1 and 2 can receive and store configuration information, in accordance with one embodiment of the present invention.

As noted, blade manager 106 can reconfigure a replacement blade 104 to take the place of a failed blade. Blade manager 106 maintains a copy of configuration information 301 of each managed blade 104. FIG. 4 is a flowchart illustrating how blade manger 106 receives and stores configuration information 301 related to blades 104a-f that are installed in the chassis 102 or in another chassis managed by the blade manager. At box 402, a blade 104 is manufactured.

At box 404, configuration information, relative to blade 104, is stored in EE-PROM 208 of the blade. The value for each item of configuration information can depend on a customer's needs. For example, if blade 104 includes four processors, but the customer purchases only one processor, configuration information 301 for that blade 104 can indicate that only one processor is enabled or licensed. (The terms "enabled" and "licensed" are used interchangeably herein.) As a further example, if blade 104 will be used as a new server, that is, not as a replacement for a failed server, a new serial number can be included in configuration information 301 stored in EE-PROM 208. On the other hand, if blade 104 will be used as a spare, that is, in case another blade fails, a special serial number or license key value can be included in configuration information 301 stored in EE-PROM 208. This special value can later indicate to blade manager 106 that this blade 104 does not have a predetermined configuration and can be used to replace any failed blade. As such, its configuration information 301 can be overwritten with information from a failed blade 104 that this blade is replacing.

Optionally, at box 406, when blade 104a is installed in the chassis 102, blade manager 106 automatically detects the newly installed blade by a process that is well known in the art. In addition, blade manager 106 can identify the slot number, in which a blade 104 was installed.

At box 408, blade manager 106 sends a command over backplane 202 to blade control circuit 208 on the newly installed blade 104. This command instructs blade control circuit 208a to fetch at least some of the configuration information 301 from EE-PROM 210a on the newly installed blade 104 and send the retrieved configuration information over backplane 202 to blade manager 106. Alternatively, the newly installed blade 104 automatically detects that it has not previously sent its configuration information 301 to blade manager 106 and, consequently, sends selected or all of its configuration information 301 to blade manager 106 without being commanded to do so by blade manager 106. To facilitate this alternative, EE-PROM 210a of the newly installed blade 104 can store a flag that indicates whether the blade 104 previously sent its configuration information 301 to blade manager 106. EE-PROM 210a can also store a serial number of blade manager 106 to which the blade most recently sent its configuration information. In this way, if the newly installed blade 104 is removed from chassis 102 and installed in another chassis, the blade will send its configuration information 301 to its new blade manager 106. As one of ordinary skill in the art would appreciate, configuration information 301 can be "pulled" by blade manager 106 from the newly installed blade 104, or configuration information 301 can be "pushed" by the newly installed blade 104 to blade manager 106.

At decision box 410, blade manager 106 compares configuration information 301 stored in its EE-PROM 212 with the configuration information transferred from the newly installed blade 104. If the blade's 104a configuration information is already stored in the blade manager's EE-PROM 212, this process completes at box 412. Otherwise, at box 414, blade manager 106 stores at least some of the received configuration information 301 in the blade manager's EE-PROM 212. Blade manager 106 can manage other blades 104. As such, blade manager EE-PROM 212 can also store configuration information related to other blades 104 managed by blade manager 106.

Blade manager 106 can also store additional information, relative to the newly installed blade 104. For example, the slot number in which the newly installed blade 104 is installed, might not be sent by the blade. However, blade manager 106 can detect the slot number and store it in EE-PROM 212 as part of configuration information 301 maintained for this newly installed blade. In general, configuration information 301 stored in the blade manager 106 is sufficient so the blade manager can use this information to reconfigure another blade 104 to serve as a replacement blade for the newly installed blade 104.

Figure 5:
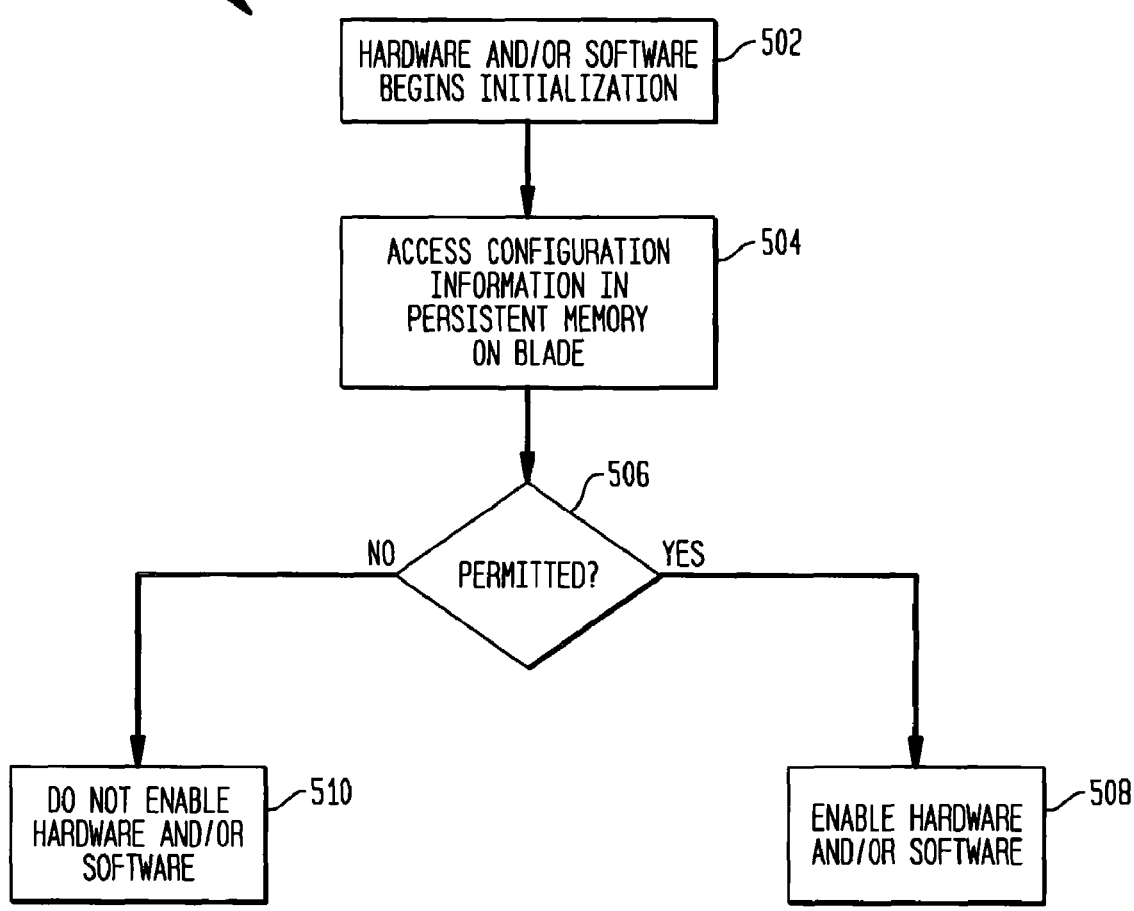
FIG. 5 is a flowchart illustrating how a blade of the blade system of FIGS. 1 and 2, or software being executed by the blade, can ascertain what capabilities of the blade or software are enabled or licensed, in accordance with one embodiment of the present invention.

FIG. 5 is a flowchart illustrating how a blade, for example, blade 104a, or software being executed by the blade, ascertains what capabilities of the blade or software are enabled or licensed. At box 502, blade control circuit 208a or software being executed by the blade begins its initialization. At box 504, blade control circuit 208 or software accesses configuration information (300, FIG. 3) stored in EE-PROM 210a of the blade. For example, if blade 104 includes two T1 telecommunication interfaces, blade control circuit 208 can consult the other enabled/licensed capabilities or information 312 in EE-PROM 210 to ascertain the number of T1 interfaces currently enabled on this blade. In another example, software can access serial number 302 or license key 310 to ascertain whether the software is licensed to be executed by this blade.

At decision box 506, if configuration information 301 indicates that the capability being tested is enabled or licensed, at box 508 the hardware or software is permitted to be used or executed. Otherwise, at box 510, the hardware or software is not permitted to be used or executed. Optionally, if the capability is not enabled or licensed, an error message can be displayed on the user interface 220 or 214.

Figure 6:
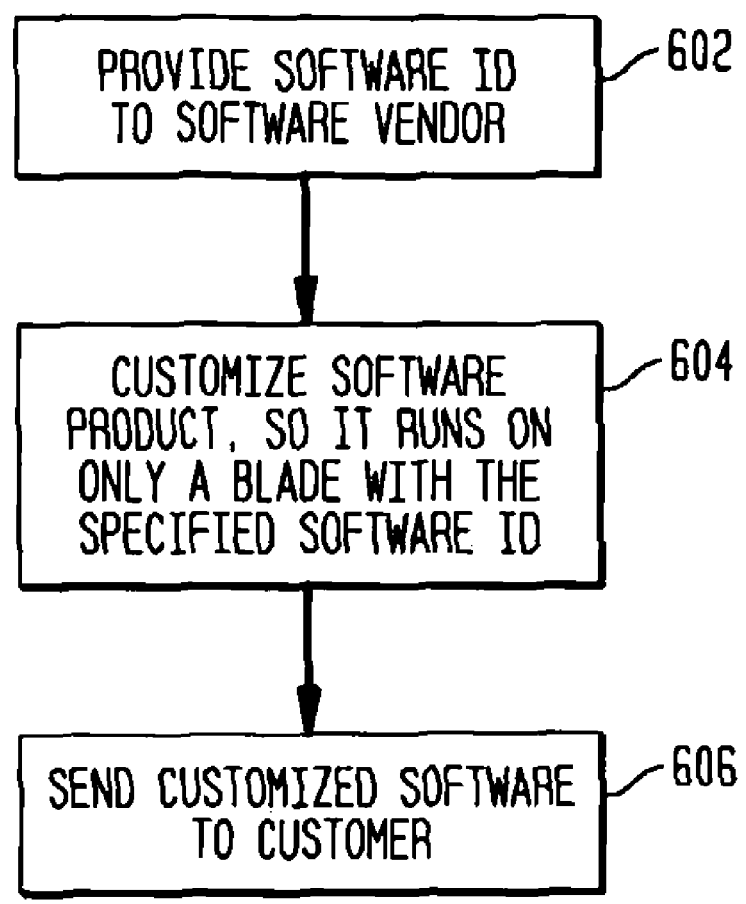
FIG. 6 is a flowchart illustrating how software can be customized, so it runs on only a licensed blade or blades of the blade system of FIGS. 1 and 2, in accordance with one embodiment of the present invention.

FIG. 6 contains a flowchart 600 illustrating how software can be customized so it can be executed on only an appropriately-licensed blade. At box 602, a system manager or customer provides a number ("software ID") that uniquely identifies the software to be licensed and the blade or blades on which the software is to be licensed. For example, each software product can have a product code, and each blade can have a serial number. A software vendor can: provide a web page that accepts both the product code and the serial number and uses an algorithm to generate a software ID.

At box 604, using the provided software ID, the software is customized so, upon startup, the software exits if the blade 104 on which it is running does not have the provided software ID stored in its EE-PROM 210. An example of this kind of testing was illustrated in the flowchart of FIG. 5. The software ID can be provided to the software vendor via a web page or otherwise when ordering the software or hardware.

At box 606, the software vendor sends the customized software to the customer for subsequent installation and use.

Figure 7:
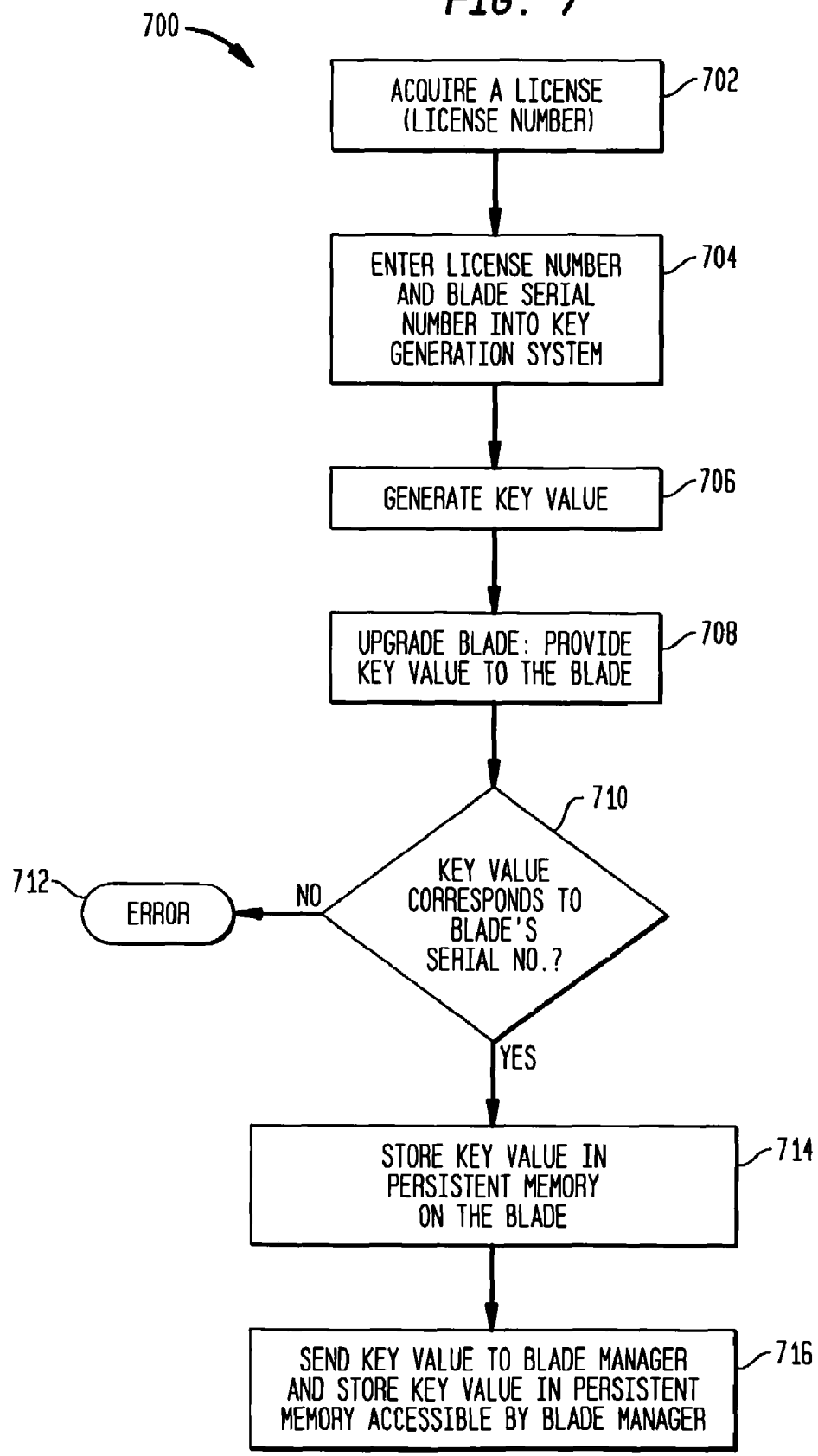
FIG. 7 is a flowchart illustrating how a blade of the blade system of FIGS. 1 and 2 can be upgraded to enable use of additional hardware components, in accordance with one embodiment of the present invention.

FIG. 7 is a flowchart 700 illustrating how a blade 104 is upgraded to enable use of additional hardware components. At box 702, a customer acquires a license and a license number for the additional hardware, e.g. by purchasing the license through an e-commerce web site or conventionally via a paper order. At box 704, the customer enters the license number and the serial number of the blade 104 that is to be upgraded. This information can be entered, for example, into a key generating system with a web interface. At box 706, a suitable algorithm generates a key value from the entered license number and serial number. At box 708, the customer provides this key value to blade 104, such as by entering it into the user interface 220 or 214.

At decision box 710, blade control circuit 208 on the blade 104 checks the entered key value to ensure it corresponds to the serial number currently stored in EE-PROM 210 of that blade 104. Blade control circuit 208 can use an algorithm similar to the one used to generate the key value to perform this check. If the entered key value does not correspond to blade's serial number, at box 712 an error can be indicated, such as on the user interface 220 or 214.

On the other hand, if the entered key value corresponds to blade's serial number, at box 714, the key value is stored in EE-PROM 210. In addition, at box 716, blade 104 sends the key value to blade manager 106 for storage in blade manager EE-PROM 212. Alternatively, blade manager 106 can "pull" the key value. After the key value is stored in EE-PROM 210, the additional hardware will be enabled, such as next time blade 104 is initialized, as per flowchart 500 in FIG. 5.

As described above, with reference to FIG. 5, a typical blade's configuration information 301 is stored in the blade's EE-PROM 208. As noted, this configuration information 301 can indicate hardware, or a subset thereof, on the blade 104 that is enabled or licensed for use or software that is enabled or licensed to be executed by the blade, that is, the module's capabilities. As previously discussed, when an electronic module is replaced, it is desirable to make a replacement module functionally equivalent to the replaced module, that is, to make the replacement blade have capabilities similar to the replaced blade. The replacement blade should have capabilities that correspond to capabilities of the replaced blade, that is, if a replaced blade had a particular capability, the replacement blade should have at least that same capability or be otherwise configured so it can used in place of the replaced blade with a minimum of human intervention. Note that additional capabilities, that is, capabilities beyond those of the replaced blade, can also be enabled on the replacement blade.

Figure 8:
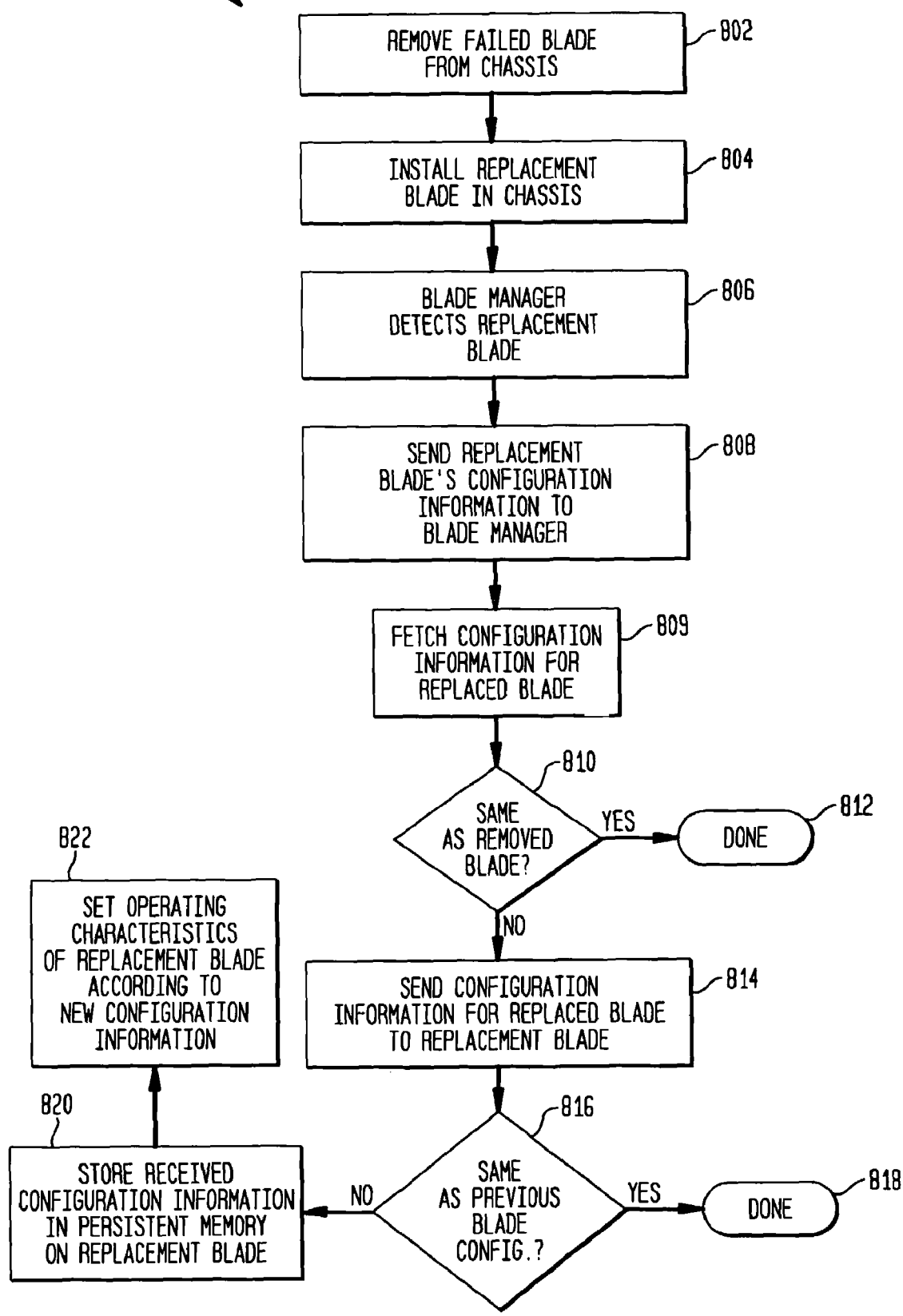
FIG. 8 is a flowchart illustrating how a replacement blade in the blade system of FIGS. 1 and 2 can be configured to enable the same hardware and execute the same software as a blade replaced by the replacement blade, in accordance with one embodiment of the present invention.

FIG. 8 contains a flowchart in which a blade 104 (replaced blade) is replaced by a replacement blade. The flowchart 800 illustrates how a replacement blade is configured to enable the same or similar capabilities as those that were enabled on the blade that is being replaced. At box 802, a failed blade 104 is removed from chassis 102. Alternatively, the failed blade 104 can be left in chassis 102 but powered off, some of its configuration information 301 can be overwritten or the failed blade can otherwise be made not to interfere with operation of the replacement blade. Of course, a blade need not have failed to be replaced. A system manager might choose to replace a working blade. In this discussion, the terms "failed" and "replaced" blade are used interchangeably.

At box 804, a replacement blade 104 is installed in chassis 102. Optionally, the replacement blade 104 is installed in the same slot, from which the failed blade was removed. Preferably, the replacement blade can be installed in any slot.

Optionally, at box 806, blade manager 106 detects the installation of the replacement blade using well-known methods. For example, installation of the replacement blade into the slot from which the failed blade was removed can trigger blade manager 106 to treat the installed blade as a replacement. Blade manager 106 can also detect the number of the slot in which the replacement blade was installed.

Blade manager 106 ascertains which blade is being replaced, or can be replaced, by the replacement blade. If only one blade failed, this determination can be trivial. If the replacement blade is installed into the slot from which the failed blade was removed, blade manager 106 can use this slot number to identify the failed blade. If the replacement blade is installed into a different slot, blade manager 106 can use information about the replacement blade to ascertain which blade is being, or can be, replaced, as described below. Alternatively, blade manager 106 can arbitrarily assume any replacement blade can replace any failed blade.

At box 808, the replacement blade's configuration information is sent to blade manager 106. As previously described, the configuration information could be pushed by the replacement blade or pulled by the blade manager. Blade manager 106 can use this information to identify the failed blade and, more particularly, to locate the failed blade's configuration information in blade manager EE-PROM 212. For example, blade manager 106 can ascertain the maximum capabilities of the replacement blade and search blade manager EE-PROM 212 for a failed blade that has equal or fewer capabilities. Alternatively, if the failed blade is repaired and reinstalled, the sent serial number can be used to identify the appropriate configuration information in EE-PROM 212. That is, blade manager 106 can search its EE-PROM 212 for configuration information 301 for a blade having the sent serial number. If the failed blade's slot number is known, blade manager 106 can use this slot number as an index into blade manager EE-PROM 212 to locate the failed blade's configuration information. Thus, at box 809, blade manager 106 can select and fetch appropriate configuration information for the replacement blade from among the configuration information the blade manager stores in its EE-PROM 212.

At decision box 810, blade manager 106 compares the configuration information 301 received from the replacement blade 104 with configuration information 301, stored in the blade manager's EE-PROM 212, that corresponds to the failed blade. If the received configuration information is identical to the configuration information for the failed blade, at box 812 the blade manager can assume the failed blade was reinstalled (possibly after having been repaired) or the replacement blade had been reconfigured by a separate process to mimic the failed blade's configuration information.

Blade manager 106 can identify the replacement blade as such by the previously-described special serial number or license key value in the blade's configuration information 301. In this case, blade manager 106 can assume the replacement blade is intended to replace the failed blade 106, even if the replacement blade is installed in a different slot than the failed blade occupied. Alternatively, a command can be entered via user interface 214 to identify a replacement blade. If the received configuration information 301, for the replacement blade 104, is different than for the failed blade 104, at box 814 blade manager 106 sends a copy of at least some of the configuration information 301 stored in blade manager EE-PROM 212, corresponding to the failed blade, to the replacement blade. This "replacement configuration information" will enable the replacement blade to be configured the same way the failed blade was configured.

At decision box 816, if the replacement configuration information received by the replacement blade is the same as corresponding configuration information stored in replacement blade EE-PROM 201, the process ends at box 818. On the other hand, if the replacement configuration information 301 is different than configuration information stored in FE-PROM 201, at box 820 blade control circuit 208 stores the received replacement configuration information in the replacement blade EE-PROM 210.

The replacement configuration information does not necessarily replace all information stored in replacement blade EE-PROM 210 prior to installation of the replacement blade. The replacement configuration information 301 preferably replaces only previously stored configuration information that would contradict, or is otherwise incompatible with, the replacement configuration information. The replacement configuration information can supplement information already stored in EE-PROM 210 of the replacement blade. In addition, if the replacement blade 104 has a capability that is not explicitly negated by the replacement configuration information, the replacement blade preferably retains that capability after the replacement configuration information is stored in the EE-PROM 210. For example, if the replaced blade 104 had two processors enabled, and the replacement blade had three processors enabled before it was installed, the replacement blade would preferably continue to have three processors enabled after the replacement configuration information is stored in the EE-PROM 210 of the replacement blade 104.

At box 822, operating characteristics of replacement blade 104 are set according to received replacement configuration information. This setting can be done upon receipt of replacement configuration information or the next time blade is started, as illustrated in the flowchart 500 of FIG. 5. This essentially enables the replacement blade to mimic or take on a "personality" equivalent to the replaced blade, in other words, to become functionally equivalent, with respect to hardware or software capabilities or licensing, from the replaced blade.

When a module 104 is assigned a different task, appropriate configuration information can be sent to the module, so the module can appropriately perform the assigned task, such as appropriately use selected hardware or execute selected software. In the following example, a blade is assigned a different task by logically connecting the blade to a different disk drive. FIG. 9 is a flowchart 900 illustrating how a blade 104 can be appropriately reconfigured to enable hardware, and execute licensed software, after the blade is logically connected to the different disk drive. Assume software (first software) stored on the disk drive (first disk drive) was customized so it could be executed only by blades having certain serial numbers or license keys or require certain hardware components. At box 902, blade manager 106 stores configuration information for a blade that is enabled to utilize the hardware components and/or is licensed to execute the software. This configuration information is stored in blade manager EE-PROM 212. This configuration information is also associate with the software or the disk drive that stores the software. For example, the disk drive's ID or the name of the software package can be stored in the other enabled/licensed capabilities or information field (312 in FIG. 3). Note that this configuration information need not necessarily be initially stored in any blade's EE-PROM, because no existing blade might yet be configured to execute this software.

At box 904, establish a logical connection between a blade 104 and a second disk drive. This logical connection can be established by blade manager 106 or the blade manager can send commands to the blade 104 to establish the connection. In addition, a request for the logical connection can come from a system manager, such as via user interface 214, or from software being executed by the blade 104.

Later, at box 906, establish a logical connection between the blade 104 and the first disk drive. This logical connection can be established by blade manager 106, or the blade manager can send commands to the blade 104 to establish the connection. The request for the logical connection can come from a system manager, such as via the user interface 214, or from software being executed by the blade 104. In either case, blade manager 106 detects, or is informed by the blade, that blade 104 is now logically connected to a different disk drive.

At box 908, blade manager 106 sends the configuration information (stored in box 902) related to the first disk drive to the blade 104a. This replacement configuration information can include a serial number, license key and/or other configuration information necessary to enable the software stored on the second disk drive to be executed by the blade 104a and use hardware on the blade.

At box 910, blade control circuit 208a stores the replacement configuration information in the EE-PROM 210a of the blade 104a. This enables the blade 104a to take on the personality of a blade that is enabled and/or licensed to execute the software. At box 912, operating characteristics of the blade 104a are set according to the received replacement configuration information. This setting can be done upon receipt of replacement configuration information or next time the blade is started, as illustrated in flowchart 500 of FIG. 5. The blade can then execute the software stored on the first disk drive.

Embodiments have been described in which the present invention is employed in a blade system to automatically or dynamically manage configuration information, and optionally license information, for blades. However, one of ordinary skill in the art can apply the teachings herein to other types of replaceable electronic modules. For example, configuration information and capabilities of integrated circuits can be similarly managed. Such integrated circuits can include functional equivalents to the persistent memory and control circuit described above. These integrated circuits can communicate, for example via a bus, with a module manager residing on the same circuit board as the integrated circuit or in another subsystem. An exemplary such integrated circuit can include a plurality of processors or be capable of executing a plurality of instructions. Through appropriate configuration information sent to the integrated circuit, some or all of the processors or instructions can be enabled or disabled.

Similarly, peripherals can include embodiments of the present invention. Monitors can, for example, communicate with remote module managers over analog or digital video signal connections, much the way power control signals are now sent over these connections. Through appropriate configuration information sent to such a monitor, capabilities, such as maximum resolution, can be set or auxiliary functions, such as integrated speakers, can be selectively enabled or disabled. In a further example, a disk drive can communicate with a module manager over an IDE, SCSI or other bus. Features or functions of the disk drive, such as an integrated defragmenter or performance monitor, can thus be selectively enabled or disabled.

The terms and expressions employed herein are used as terms of description, not of limitation. There is no intention, in using these terms and expressions, to exclude any equivalents of the features shown or described or portions thereof. Practitioners in the art will recognize that other modifications are possible within the scope of the invention.

What is claimed is:

1. A replaceable electronic module comprising:
   a persistent memory;
   enabled configuration information, which is stored in the persistent memory, and which identifies enabled capabilities of the replaceable electronic module to utilize permitted portions of hardware from said replaceable electronic module or to execute permitted software; and
   a replaceable electronic module controller configured to:
   enable capabilities of the replaceable electronic module according to enabled configuration information stored in the persistent memory;
   send at least a portion of the enabled configuration information stored in the persistent memory to an automatic replaceable electronic module manager; and
   receive replacement enabled configuration information from the automatic replaceable electronic module manager and store the replacement enabled configuration information in the persistent memory.

2. The replaceable electronic module of claim 1, wherein the replaceable electronic module controller is further configured to notify the automatic replaceable electronic module manager when the replaceable electronic module is installed.

3. The replaceable electronic module of claim 1, further comprising at least one electronic component; and wherein the enabled configuration information stored in the persistent memory indicates that all or a portion of the at least one electronic component is permitted to be used.

4. The replaceable electronic module of claim 3, wherein the at least one electronic component comprises a plurality of processors, and wherein the enabled configuration information stored in the persistent memory indicates that all or a portion of the plurality of processors is permitted to be used.

5. The replaceable electronic module of claim 1, wherein the enabled configuration information stored in the persistent memory comprises a serial number of the replaceable electronic module.

6. The replaceable electronic module of claim 1, wherein the enabled configuration information stored in the persistent memory comprises an enabled license key.

7. The replaceable electronic module of claim 1, wherein the enabled configuration information stored in the persistent memory indicates that the replaceable electronic module is permitted to execute predetermined software.

8. The replaceable electronic module of claim 1, wherein the replaceable electronic module is a blade.

9. The replaceable electronic module of claim 1, wherein the replaceable electronic module is an integrated circuit.

10. The replaceable electronic module of claim 1, wherein the replaceable electronic module is a disk drive.

11. An electronic system for automatic maintenance of a replaceable electronic module, comprising:
    the replaceable electronic module and an automatic replaceable electronic module manager;
    wherein the replaceable electronic module comprises:
    a first persistent memory;
    enabled configuration information, which is stored in the first persistent memory, and which identifies enabled capabilities of the replaceable electronic module to utilize permitted portions of hardware from said replaceable electronic module or to execute permitted software; and
    a controller configured to:
    enable capabilities of the replaceable electronic module according to enabled configuration information stored in the first persistent memory;
    send at least a portion of the enabled configuration information stored in the first persistent memory to the automatic replaceable electronic module manager; and
    receive replacement enabled configuration information from the automatic replaceable electronic module manager and store the replacement enabled configuration information in the first persistent memory; and
    wherein the automatic replaceable electronic module manager comprises:
    a second persistent memory; and
    wherein the automatic replaceable electronic module manager is configured to:
    receive the enabled configuration information sent by the replaceable electronic module;
    store the enabled configuration information received from the replaceable electronic module in the second persistent memory; and
    send at least a portion of the enabled configuration information stored in the second persistent memory to the replaceable electronic module as the replacement enabled configuration information.

12. The electronic system of claim 11, wherein the controller is further configured to notify the automatic replaceable electronic module manager when the replaceable electronic module is installed.

13. The electronic system of claim 11, wherein the replaceable electronic module further comprises at least one electronic component; and wherein the enabled configuration information stored in the first persistent memory indicates that all or a portion of the at least one electronic component is permitted to be used.

14. The electronic system of claim 13, wherein the at least one electronic component comprises a plurality of processors, and wherein the enabled configuration information stored in the persistent memory indicates that all or a portion of the plurality of processors is permitted to be used.

15. The electronic system of claim 11, wherein the enabled configuration information stored in the first persistent memory comprises a serial number of the replaceable electronic module.

16. The electronic system of claim 11, wherein the enabled configuration information stored in the first persistent memory comprises a license key.

17. The electronic system of claim 11, wherein the enabled configuration information stored in the first persistent memory indicates that the replaceable electronic module is permitted to execute predetermined software.

18. The electronic system of claim 11, wherein the replaceable electronic module is a blade.

19. The electronic system of claim 11, wherein the replaceable electronic module is an integrated circuit.

20. The electronic system of claim 11, wherein the replaceable electronic module is a disk drive.

21. A method of licensing software for execution by a replaceable electronic module, the replaceable electronic module being installed in, and removable from, a system that includes an automatic replaceable electronic module manager, comprising:

provided an enabled license key, which identifies enabled capabilities of the replaceable electronic module to execute the software, the license key comprising data;

providing the enabled license key to the replaceable electronic module, which is thereby enabled to execute the software;

sending the enabled license key from the replaceable electronic module to the automatic replaceable electronic module manager; and storing the enabled license key in a first persistent memory that is not on the replaceable electronic module and that is thereafter accessible by the automatic replaceable electronic module manager regardless of whether the replaceable electronic module remains installed or is subsequently removed from the system.

22. The method of claim 21, further comprising:

replacing the replaceable electronic module with a replacement replaceable electronic module;

fetching the enabled license key from the first persistent memory;

sending the enabled license key to the replacement replaceable electronic module; and storing the enabled license key in a second persistent memory on the replacement replaceable electronic module, which is thereby enabled to execute the software.

* * * * *

UNITED STATES PATENT AND TRADEMARK OFFICE
CERTIFICATE OF CORRECTION

| | | |
|---|---|---|
| PATENT NO. | : 7,870,312 B2 | Page 1 of 1 |
| APPLICATION NO. | : 12/047254 | |
| DATED | : January 11, 2011 | |
| INVENTOR(S) | : William J. Thomas | |

It is certified that error appears in the above-identified patent and that said Letters Patent is hereby corrected as shown below:

In column 13, line 26, delete "invention." and insert -- invention claimed. --, therefor.

Signed and Sealed this
Ninth Day of August, 2011

David J. Kappos
*Director of the United States Patent and Trademark Office*